United States Patent
Kim et al.

(10) Patent No.: US 7,828,448 B2
(45) Date of Patent: Nov. 9, 2010

(54) ILLUMINATION UNIT AND IMAGE PROJECTION APPARATUS EMPLOYING THE SAME

(75) Inventors: Jong-hoi Kim, Suwon-si (KR);
Won-yong Lee, Suwon-si (KR);
Young-chol Lee, Gunpo-si (KR);
Kye-hoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1259 days.

(21) Appl. No.: 11/392,633

(22) Filed: Mar. 30, 2006

(65) Prior Publication Data
US 2006/0221310 A1    Oct. 5, 2006

Related U.S. Application Data

(60) Provisional application No. 60/666,181, filed on Mar. 30, 2005.

(30) Foreign Application Priority Data
May 27, 2005    (KR) .................. 10-2005-0045200

(51) Int. Cl.
| | |
|---|---|
| G03B 21/28 | (2006.01) |
| G03B 21/26 | (2006.01) |
| G01D 11/28 | (2006.01) |
| F21V 7/00 | (2006.01) |
| H04N 5/74 | (2006.01) |

(52) U.S. Cl. .................. 353/99; 353/94; 362/26; 362/555; 362/217.05; 362/241; 362/243; 362/245; 362/296.01; 362/346; 348/771; 359/904

(58) Field of Classification Search .............. 353/99, 353/94, 98; 362/26, 612, 551, 555, 582, 362/217.05, 241, 243, 245, 296.01, 341, 362/346; 348/771; 359/904; 313/372, 475
See application file for complete search history.

(56) References Cited

U.S. PATENT DOCUMENTS

| | | | |
|---|---|---|---|
| 5,461,500 A * | 10/1995 | Tsuji et al. ............... 349/9 |
| 6,840,623 B2 * | 1/2005 | Li ........................ 353/20 |
| 6,856,727 B2 | 2/2005 | Li | |
| 2005/0018147 A1 * | 1/2005 | Lee et al. ................ 353/98 |
| 2006/0067090 A1 | 3/2006 | Lee et al. | |
| 2006/0203486 A1 | 9/2006 | Lee et al. | |
| 2006/0221310 A1 | 10/2006 | Kim et al. | |

FOREIGN PATENT DOCUMENTS

| | | |
|---|---|---|
| CN | 1555509 A | 12/2004 |
| JP | 4-63321 A | 2/1992 |
| JP | 05-107643 A | 4/1993 |
| JP | 06-308611 A | 11/1994 |

(Continued)

*Primary Examiner*—Georgia Y Epps
*Assistant Examiner*—Magda Cruz
(74) *Attorney, Agent, or Firm*—Sughrue Mion, PLLC

(57) ABSTRACT

An illumination unit and an image projection apparatus employing the same. The illumination unit includes: a first reflective surface reflecting light incident thereon; a light-emitting device generating and emitting illuminating light; and a second reflective surface reflecting light emitted from the light-emitting device to a light source surface that includes the light-emitting device.

31 Claims, 7 Drawing Sheets

FOREIGN PATENT DOCUMENTS

| | | |
|---|---|---|
| JP | 2000-180962 A | 6/2000 |
| JP | 2001-14919 A | 1/2001 |
| JP | 2002-189263 A | 7/2002 |
| JP | 2003-5168 A | 1/2003 |
| JP | 2004-053949 A | 2/2004 |
| JP | 2004-170630 A | 6/2004 |
| JP | 2004228143 A | 8/2004 |
| JP | 2006-267579 A | 10/2006 |
| KR | 2002-0033112 A | 5/2002 |
| WO | 2004/109366 A1 | 12/2004 |

\* cited by examiner

ILLUMINATION UNIT AND IMAGE PROJECTION APPARATUS EMPLOYING THE SAME

CROSS-REFERENCE TO RELATED PATENT APPLICATION

This application claims the benefit of U.S. Patent Provisional Application No. 60/666,181, filed on Mar. 30, 2005 and Korean Patent Application No. 10-2005-0045200, filed on May 27, 2005, in the Korean Intellectual Property Office, the disclosure of which is incorporated herein in its entirety by reference.

BACKGROUND OF THE INVENTION

1. Field of the Invention

The present invention relates to an illumination unit capable of increasing the efficiency of collecting light emitted from a light source and an image projection apparatus employing the illumination unit.

2. Description of the Related Art

In general, illumination units include a light source emitting light, and an illumination optical system transmitting light emitted from the light source. Illumination units are widely used for image projection apparatuses which create an image using an image-forming device such as a liquid crystal display (LCD) device or a digital light processing panel (DLP) comprised of a two dimensional array of micromirrors.

A metal halide lamp or a super-high voltage mercury lamp has been used as a light source of an illumination unit. Since the life span of these lamps is several thousands hours at most, the lamps need to be frequently replaced. To solve this problem, research on the use of a compact light-emitting device such as a light-emitting diode (LED) having a relatively longer life span has been conducted. Since an LED radiates light divergently, an illumination unit needs to collect and collimate the light emitted from the LED such that the light can propagate in one direction.

The LED emits relatively less light than the metal halide lamp or the super-high voltage mercury lamp. Accordingly, an array of LED modules must be used as a light source of image projection apparatuses.

To collimate light emitted from an LED, the LED modules generally comprise lenses. The array of LED modules using general lenses has low light efficiency as explained below.

The product of the emission area and the solid angle of the light emitted by the LED is a conserved value called the "etendue". Since the etendue is conserved, the product of the emission area and the solid angle of the light emitted by the LED should be equal to the product of the area of the image-forming device and the solid angle of incidence of the image-forming device. The etendue of the image-forming device is determined geometrically.

When an array of LED modules is used, the emission area of the array of LED modules is larger than the emission area of one LED module because the emission area increases in proportion to the number of LED modules.

Here, the solid angle of emission of each LED module is identical to the solid angle of emission of the array of LED modules, and the area of the image-forming device is fixed. According to etendue conservation, the solid angle of the incidence of the image-forming device is greater when the array of LED modules is used than when one LED module is used. Accordingly, some light exists outside the range of solid angle where light can be effectively projected by a projection lens and loss of light occurs, thereby reducing light efficiency.

As a result, the luminance of the image-forming device is limited in spite of a greater number of LEDs.

SUMMARY OF THE INVENTION

The present invention provides an illumination unit capable of increasing the efficiency of collecting light emitted from a light source and an image projection apparatus employing the illumination unit.

According to an aspect of the present invention, there is provided an illumination unit comprising: a first reflective surface reflecting light incident thereon; a light-emitting device generating and emitting illuminating light; and a second reflective surface reflecting light emitted from the light-emitting device to a light source surface that includes the light-emitting device.

The first reflective surface may have a focal point, and the light-emitting device may be disposed at or around the focal point of the first reflective surface.

At least one of the first and second reflective surfaces may be selected from the group consisting of a parabolic reflective surface, a spherical reflective surface, and an elliptical reflective surface.

The first reflective surface may be a parabolic reflective surface and the second reflective surface may be a spherical reflective surface. A spherical center of the second reflective surface and the focal point of the first reflective surface may coincide.

The light-emitting device may be an organic light-emitting diode (OLED) or a light-emitting diode (LED).

The illumination unit may comprise a transparent light collector having a light incident surface, on which the second reflective surface is formed on a certain area of the light incident surface, and an outer side surface on which the first reflective surface is formed.

The light collector may include a light guide portion guiding light reflected by the first reflective surface.

The light incident surface of the light collector may be concave, and a predetermined optical medium or an air layer may exist between the light-emitting device and the light incident surface of the light collector.

The light incident surface of the light collector may have a concave dome shape.

The illumination unit may comprise a two-dimensional array of light collectors and a plurality of the light-emitting devices respectively corresponding to each of the light collectors.

According to another aspect of the present invention, there is provided an image projection apparatus comprising: at least one illumination unit; an image-forming device generating an image in response to an input image signal by using light emitted from the illumination unit; and a projection lens unit enlarging and projecting the image formed by the image-forming device, wherein the illumination unit comprises: a first reflective surface reflecting light incident thereon; a light-emitting device generating and emitting illuminating light; and a second reflective surface reflecting light emitted from the light-emitting device to a light source surface that includes the light-emitting device.

The at least one illumination unit may comprise a plurality of the illumination units emitting light of different colors, and the image projection apparatus may further comprise a color synthesis prism synthesizing the light of different colors emitted from the plurality of illumination units such that the synthesized light of different colors propagates along one optical path.

The image projection apparatus may further comprise a light integrator transforming the light of different colors emitted from the plurality of illumination units into uniform light.

The image-forming device may be selected from the group consisting of a transmissive liquid crystal display device, a reflective liquid crystal display device, and a reflective image-forming device comprising an array of micromirrors that selectively reflect the light emitted from the illumination units to form an image.

The illumination unit may comprise a transparent light collector that includes a concave dome-shaped light incident surface and a light guide portion guiding light reflected by the first reflective surface. The second reflective surface may be formed on a certain area of the light incident surface of the light collector on which light is incident from the light-emitting device, the first reflective surface may be formed on an outer side surface of the light collector, and a predetermined optical medium or an air layer may exist between the light-emitting device and the light incident surface of the light collector. The at least one illumination unit may comprise a plurality of illumination units emitting light of different colors. The image projection apparatus may further comprise: a color synthesis prism synthesizing the light of different colors emitted from the plurality of illumination units such that the synthesized light of different colors propagates along one optical path; and a light integrator transforming the light emitted from the plurality of illumination units into uniform light. The image-forming device may be selected from the group consisting of a transmissive liquid crystal display device, a reflective liquid crystal display device, and a reflective image-forming device comprising an array of micromirrors that selectively reflect the light emitted from the illumination units to form an image.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

An illumination unit according to the present invention has better light collecting efficiency than a conventional illumination unit disclosed in U.S. patent application Ser. No. 11/119,918, entitled "illumination unit using LED and an, image projecting apparatus employing the same", owned by the applicant of the present invention.

Figure 1:
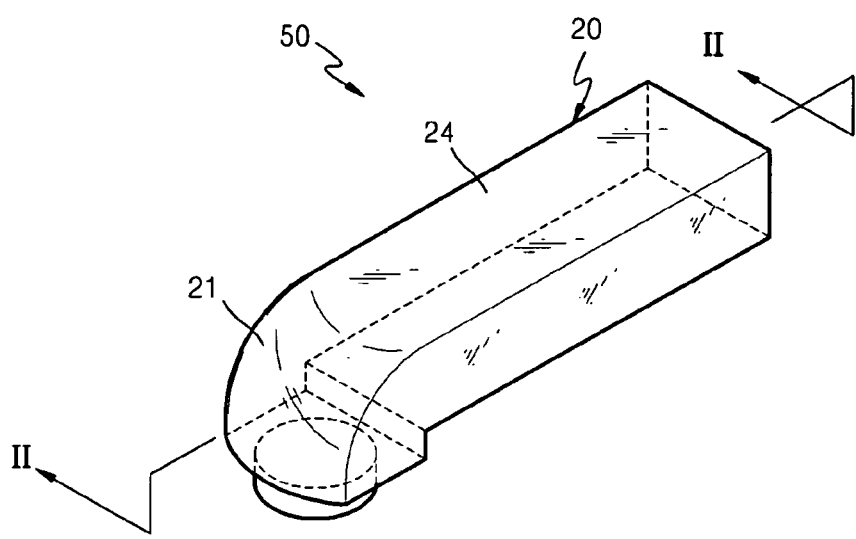
FIG. 1 is a perspective view of an illumination unit disclosed in U.S. patent application Ser. No. 11/119,918.
Figure 2:
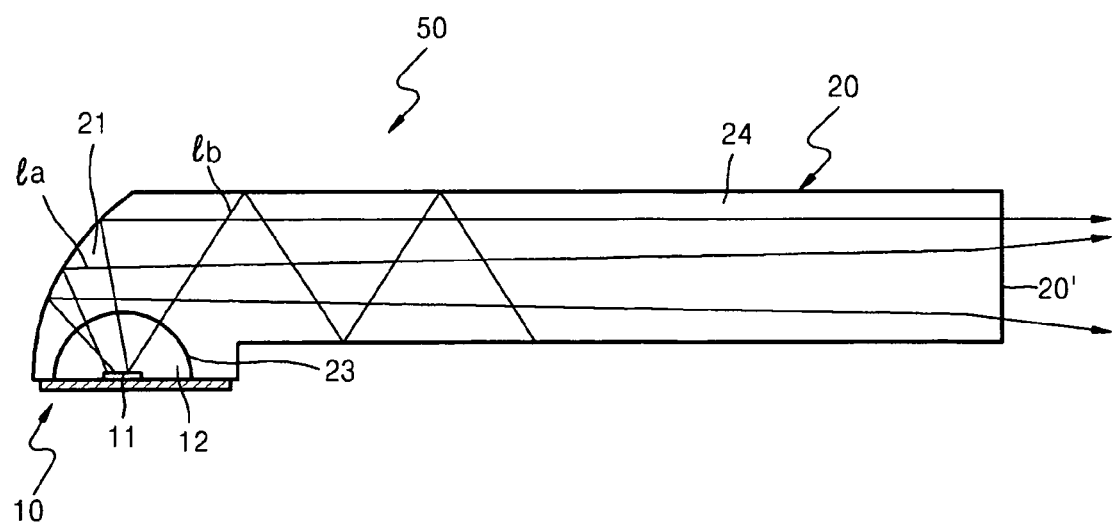
FIG. 2 is a cross-sectional view taken along line II-II of FIG. 1.

FIG. 1 is a perspective view of an illumination unit 50 disclosed in U.S. patent application Ser. No. 11/119,918. FIG. 2 is a cross-sectional view taken along line 11-11 of FIG. 1.

Referring to FIGS. 1 and 2, the illumination unit 50 includes a light-emitting diode (LED) module 10 and a transparent rod 20. The rod 20 includes a parabolic reflective surface 21, and a light guide portion 24 guiding light reflected by the parabolic reflective surface 21. A recession 23 is formed in a surface of the rod 20 on which light is incident. The light guide portion 24 has a rectangular cross-section.

The LED module 10 includes an LED chip 11 emitting light. The LED module 10 may further include a dome lens or cap 12. The LED module 10 is disposed at a focal point of the parabolic reflective surface 21.

Light emitted from the LED chip 11 and incident on the parabolic reflective surface 21 is reflected by the parabolic reflective surface 21 to be collimated into substantially parallel light and then is guided by the light guide portion 24 to be emitted out of the illumination unit.

In the illumination unit 50, light 1a incident on the parabolic reflective surface 21, among the light emitted from the LED chip 11, is collimated into substantially parallel light. The light 1a is guided to a light exit surface 20' of the rod 20 along the light guide portion 24. Light 1b emitted from the LED chip 11 and proceeding outside the region of the parabolic reflective surface 21 (right side of LED chip 11 in FIG. 1) is not collimated into parallel light because it directly enters the light guide portion 24 without reflecting from the parabolic reflective surface 21. Accordingly, it is difficult to collect the light 1b, thereby reducing light collecting efficiency.

However, an illumination unit according to the present invention can collimate light proceeding outside of the parabolic reflective surface 21 and propagating directly into the light guide portion so as to increase light collecting efficiency.

Figure 3:
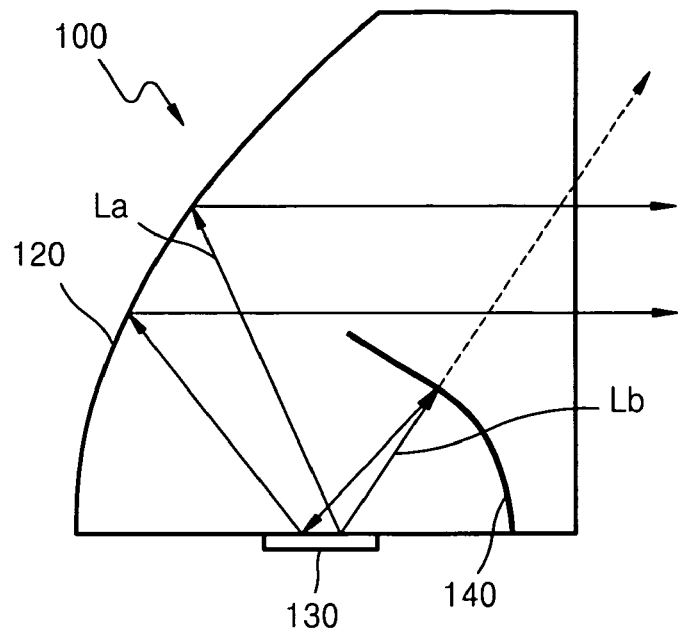
FIG. 3 is a conceptual view illustrating essential elements of an illumination unit according to an embodiment of the present invention.
Figure 4:
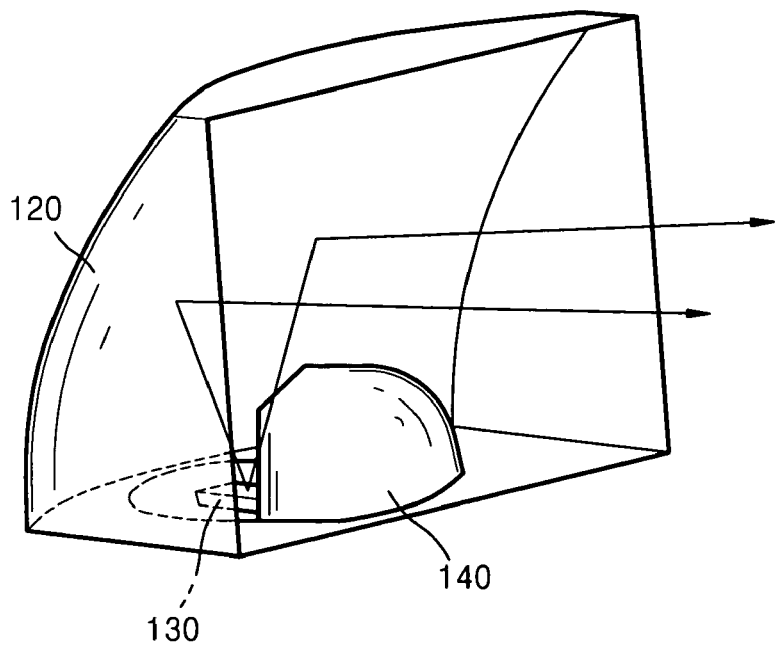
FIG. 4 is a perspective view of the illumination unit of FIG. 3.

FIG. 3 is a conceptual view illustrating essential elements of an illumination unit 100 according to an embodiment of the present invention. FIG. 4 is a perspective view of the illumination unit 100 of FIG. 3.

Referring to FIGS. 3 and 4, the illumination unit 100 includes a first reflective surface 120 reflecting light incident thereon, a light-emitting device 130 generating and emitting light, and a second reflective surface 140 reflecting light Lb. The light Lb is light emitted by the light-emitting device 130 and propagating outside the region of the first reflective surface 120. The light Lb is reflected by the second reflective surface to a light source surface (see 131 in FIGS. 5 and 6) that includes a light emission surface 130a of the light-emitting device 130.

The first reflective surface 120 is curved and has a focal point. The first reflective surface 120 may be selected from the group consisting of a parabolic reflective surface, a spherical reflective surface, and an elliptical reflective surface. The first reflective surface 120 reflects the light from the light-emitting device 130 and collimates the same into substantially parallel light.

The light-emitting device 130 may be disposed at or around the focal point of the first reflective surface 120. The light-emitting device 130 may include a light-emitting device chip, such as an LED or an organic light-emitting diode (OLED), which is also called an organic electroluminescent (EL) device.

The light-emitting device 130 may have reflective properties so that it may reflect external incident light. Since the light-emitting device chip such as the LED has a smooth surface, it has a predetermined reflectance. That is, the light-emitting device 130 may have the basic reflective properties of the light-emitting device chip.

The light-emitting device 130 may, in addition to such basic reflective properties, also include a reflective layer (not shown) to further increase reflectance of external light incident thereon. For example, the reflective layer may be formed between a substrate of the light-emitting device 130 and a semiconductor layer stacked on the substrate. In this case, the efficiency of reflecting light by means of the second reflective surface 140 to the light-emitting device 130, and reflecting light by means of the light-emitting device 130 to the first reflective surface 120, can be further increased.

Figure 5:
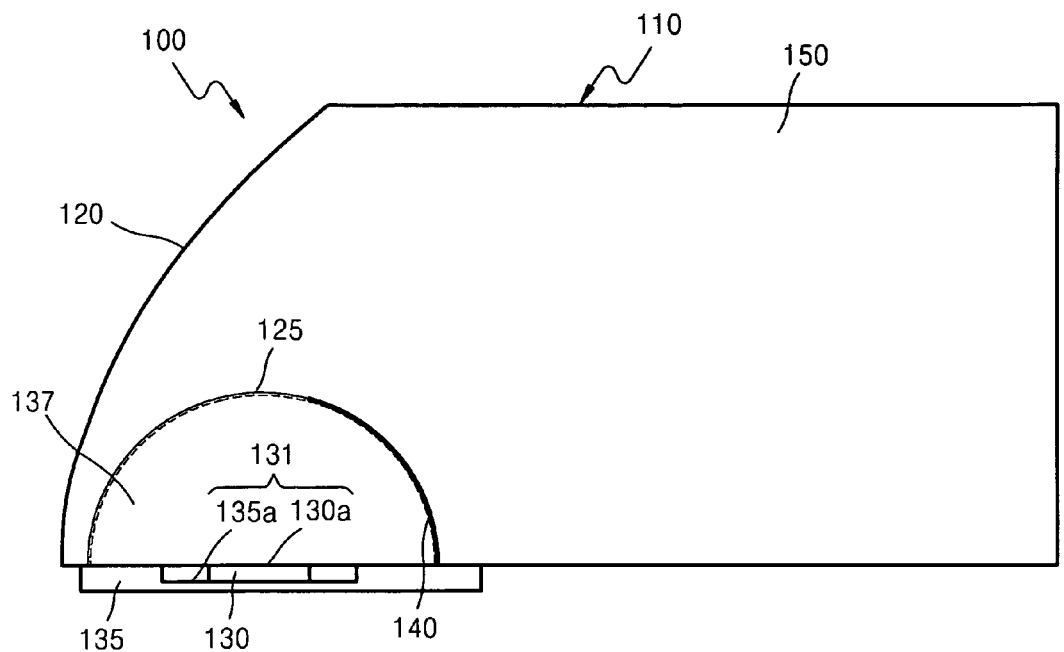
FIGS. 5 and 6 are cross-sectional views of illumination units according to other embodiments of the present invention.
Figure 6:
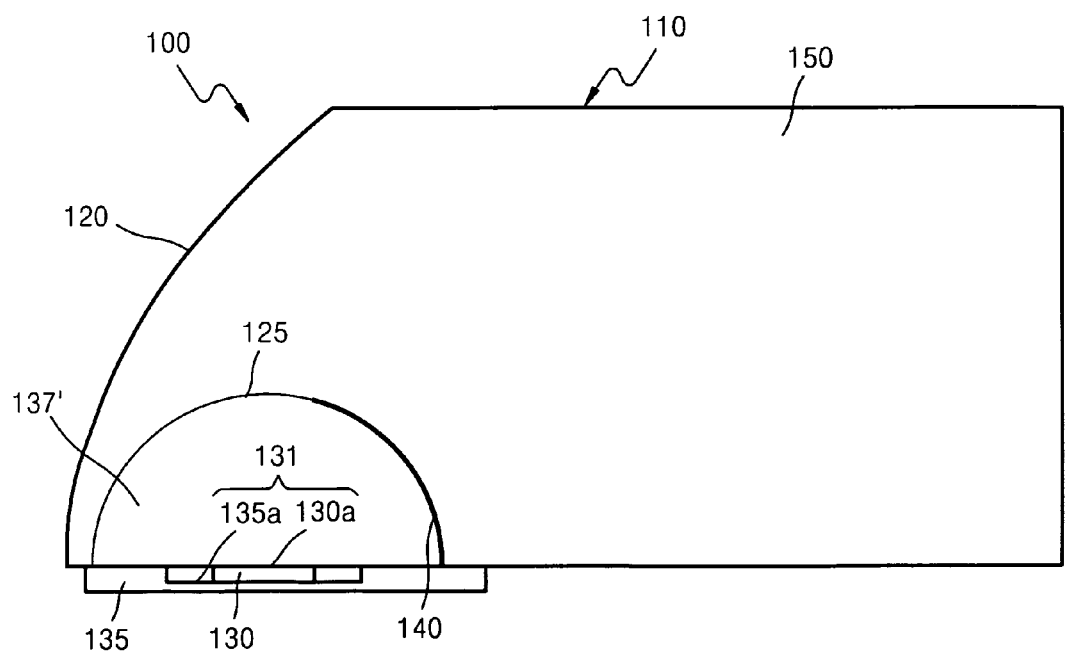

Since the light-emitting device 130 is not a point light source but an area light source, some of the light reflected by the second reflective surface 140 may be incident outside the region of the light-emitting device 130. Accordingly, the light-emitting device 130 may be installed on a base 135 as shown in FIGS. 5 and 6, and in this case, the base 135 may have a reflective surface that reflects the light, which is reflected by the second reflective surface 140 and incident on the base 135, to the first reflective surface 120. Referring to FIGS. 5 and 6, the light source surface 131 may include the light emission surface 130a of the light-emitting device 130 or the sum region of the light emission surface 130a and the incident light reflecting region 135a of the base 135.

The second reflective surface 140 reflects the light Lb propagating outside the region of the first reflective surface 120 to the light source surface 131 that includes the light-emitting device 130 so that the light reflected by the light source surface 131 propagates toward the first reflective surface 120. A dotted line in FIG. 3 represents a possible path of light proceeding outside the region of the first reflective surface 120 such that the output light lacks collimation as parallel light when the second reflective surface 140 is not present.

The second reflective surface 140 may be selected from the group consisting of a parabolic reflective surface, a spherical reflective surface, and an elliptical reflective surface, like the first reflective surface 120.

A considerable amount of the light reflected by the second reflective surface 140 to be directed to the light-emitting device 130 and then, to the first reflective surface 120 is collimated into parallel light by the first reflective surface 120.

Accordingly, since the illumination unit 100 according to the present embodiment includes the second reflective surface 140 to reflect and feed the light Lb propagating in the region beyond the first reflective surface 120 back to the light-emitting device 130, the illumination unit 100 has higher light collecting efficiency than the illumination unit disclosed in U.S. patent application Ser. No. 11/119,918.

The propagation of light with respect to the first and second reflective surfaces 120 and 140 according to various embodiments of the present invention will now be explained from the point of view of the collimation of light emitted from the illumination unit 100 into substantially parallel light rays.

For example, the first reflective surface 120 may be a parabolic reflective surface and the second reflective surface 140 may be a spherical reflective surface. The light-emitting device 130 may be disposed at or around a focal point of the first reflective surface 120, or at a spherical center of the second reflective surface 140. The focal point of the first reflective surface 120 and the spherical center of the second reflective surface 140 may be identical to each other, in which case the light-emitting device 130 may be disposed at the focal point of the first reflective surface 120 and at the spherical center of the second reflective surface 140.

In this case, light La emitted from the light-emitting device 130, which is disposed at the focal point of the first reflective surface 120, and propagating to the parabolic first reflective surface 120 is reflected and collimated by the first reflective surface 120 into substantially parallel light. The light Lb emitted from the light-emitting device 130 and propagating to the spherical second reflective surface 140 is reflected by the second reflective surface 140 and focused on the light-emitting device 130. The focused light is reflected by the light-emitting device 130 to propagate divergently to the first reflective surface 120 and then is collimated by the first reflective surface 120 into substantially parallel light to travel in the same direction as the light La that is emitted from the light-emitting device 130 and directly incident on the first reflective surface 120.

When the first reflective surface 120 is a parabolic reflective surface and the second reflective surface 140 is a spherical reflective surface, in this way, diverging light emitted from the light-emitting device 130 can be collimated into substantially parallel light to maximize the amount of light effectively emitted from the illumination unit 100.

Even when the first reflective surface 120 is a parabolic reflective surface and the light-emitting device 130 is disposed at the focal point of the first reflective surface 120, the light emitted from the light-emitting device 130 is collimated by the first reflective surface 120 into substantially parallel light, but not perfectly parallel light, because the light-emitting device 130 is not a point light source but an area light source. Since the light-emitting device 130 is an area light source, despite the spherical second reflective surface 140, not all the light reflected by the second reflective surface 140 is focused on one point of the light-emitting device 130. Still, a high percentage of the light is focused on the light-emitting device 130.

In the illumination unit 100, the light generated and emitted by the light-emitting device 130 is collimated into substantially parallel light. Here, the term "substantially parallel light" includes nearly parallel light having a divergent angle or a convergent angle within a range where the light can be collected by subsequent optical components.

Various embodiments are possible within the combination wherein each of the first reflective surface 120 and the second reflective surface 140 may be selected from one of a parabolic reflective surface, a spherical reflective surface, or an elliptical reflective surface.

For example, the first reflective surface 120 may be a spherical reflective surface to reflect divergent light emitted from the light-emitting device 130 disposed at or around a focal point of the first reflective surface 120 and collimate the reflected light into substantially parallel light.

The first reflective surface 120 may be an elliptical reflective surface to reflect divergent light emitted from the light-emitting device 130 disposed at or around a focal point of the first reflective surface 120 and collimate the reflected light into substantially parallel light.

As is well known, an ellipse has two focal points. Accordingly, divergent light emitted from the light-emitting device 130 disposed at one focal point incident on the elliptical reflective surface is reflected by the elliptical reflective surface to be focused on the other focal point of the elliptical reflective surface.

Accordingly, when the first reflective surface 120 is an elliptical reflective surface having two focal points distant from each other, light reflected by the first reflective surface 120 can be collimated into almost parallel light. Thus, when the first reflective surface 120 is an elliptical reflective surface close to a parabolic reflective surface, light reflected by the first reflective surface 120 can be collimated into substantially parallel light. Also, when the first reflective surface 120 is an elliptical reflective surface close to a spherical reflective surface, light reflected by the first reflective surface 120 can be collimated into substantially parallel light. The spherical reflective surface is an elliptical reflective surface whose two focal points coincide with each other.

Accordingly, even when the first reflective surface 120 is an elliptical reflective surface, light incident from the light-emitting device 130 can be collimated into substantially parallel light. The ratio of substantially parallel light which can be collected changes with the ellipticity of the first reflective surface 120.

The second reflective surface 140 may be a parabolic reflective surface, an elliptical reflective surface, or most preferably, a spherical reflective surface. Although the amount of light reflected by the parabolic or elliptical second reflective surface 140 to the light source surface 131 including the light-emitting device 130 and directed to and reflected by the first reflective surface 120 to be collimated into substantially parallel light is less than the amount of collimated substantially parallel light obtained through the usage of the spherical second reflective surface 140, the overall light collecting efficiency can be greatly increased with the use of the second reflective surface 140 compared to the case when the second reflective surface 140 is not used.

In describing the reflective surfaces 120 and 140, the term "parabolic surface" does not denote a parabolic surface strictly having a conic coefficient K of −1. The term "parabolic surface" used herein denotes an aspherical surface having a conic coefficient K between −0.4 and −2.5, preferably, between −0.7 and −1.6. The conic coefficient K for the parabolic surface may be appropriately selected within the above range so as to collimate light emitted from the light-emitting device 130 within a range of radiation angles which result in effective illumination of an object.

The illumination unit 100 constructed as above permits the divergent light La emitted from the light-emitting device 130 and propagating to the first reflective surface 120 to be reflected and collimated by the first reflective surface 120. The reflected light is formed as parallel light according to the structure of the first reflective surface 120.

Since the light Lb emitted from the light-emitting device 130 and not propagating toward the first reflective surface 120 cannot be collimated in a conventional illumination unit, light collecting efficiency is deteriorated. To solve this problem, the illumination unit 100 of the present embodiment includes the second reflective surface 140 which reflects the light Lb to the light source surface 131 so that the light reflected by the light source surface 131 can be guided toward the first reflective surface 120, thereby being formed as parallel light by the first reflective surface 120.

The illumination unit 100 can increase light collecting efficiency by reflecting at least some of the light Lb, which is not produced as parallel light in a conventional illumination unit, by means of the second reflective surface 140 back to the light source surface 131.

Consequently, the illumination unit 100 according to the present embodiment can achieve higher light collecting efficiency than the illumination unit 100 disclosed in U.S. patent application Ser. No. 11/119,918 filed by the applicant of the present invention.

FIGS. 5 and 6 are cross-sectional views of illumination units 100 according to other embodiments.

Referring to FIGS. 5 and 6, the illumination unit 100 includes a transparent light collector 110 having a light incident surface 125 on which light is incident from the light-emitting device 130. The second reflective surface 140 may be formed on a certain area of the light incident surface 125 of the light collector 110, and the first reflective surface 120 may be formed on an outer side surface of the light collector 110.

The light incident surface 125 is concave. The light incident surface 125 may have a concave dome shape. In this case, the light-emitting device 130 can be disposed at a focal point of the first reflective surface 120, and the second reflective surface 140 can be formed with a dome shape on a certain area of the light incident surface 125. The light-emitting device 130 is installed on the base 135, and the base 135 is coupled to the light collector 110. The base 135 may have a reflective surface that can reflect light reflected by the second reflective surface 140 to the first reflective surface 120 as described above. The surface of the base 135 may be coated to reflect light.

In the illumination unit 100 according to the present embodiment, a predetermined optical medium 137 having a refractive index higher than air may be disposed between the light-emitting device 130 and the light incident surface 125 as shown in FIG. 5. Alternatively, an air layer 137' may be filled between the light-emitting device 130 and the light incident surface 125 as shown in FIG. 6.

The optical medium 137 may be a dome lens or cap of the light-emitting device 130. The optical medium 137 may be a medium additionally filled between the light-emitting device 130 and the light incident surface 125. When the light-emitting device 130 includes a dome lens or cap and the optical medium 137 exists, the refractive index of the optical medium 137 may be equal to the refractive index of the transparent light collector 110, or may be between the refractive index of the dome lens or cap and the refractive index of the transparent light collector 110.

In the illumination unit 100 of the present embodiment, the light collector 110 may further include a light guide portion 150 extending from the transparent body of the light collector 110. The light guide portion 150 guides light reflected by the first reflective surface 120 and collimated into parallel light. The light guide portion 150 may have a rectangular cross-section.

The light guide portion 150 may be formed to be stepped to decrease the area of the cross-section of the light guide portion 150 with respect to the portion of the light collector 110 where the light-emitting device 130 is coupled. That is, the light-emitting device 130 may protrude downward from the light collector 110 such that the light-emitting device 130 is lowered below the light guide portion 150. There exists the area which blocks light propagating to the light guide portion 150, i.e., the second reflective surface 140. Thus, to focus light at a center of a light exit surface of the light guide portion 152, not at an upper portion of the light exit surface of the light guide portion 152, the light guide portion 150 should be stepped.

The amount by which the light guide portion 150 is stepped with respect to the portion of the light collector 110 where the light-emitting device 130 is coupled can be appropriately determined within a range allowing light to be uniformly emitted from the entire light exit surface of the light guide portion 150 considering the size of the light blocking area of the second reflective surface 140.

When the light guide portion 150 is stepped above the portion of the light collector 110 where the light-emitting device 130 is coupled, modules of the light-emitting device 130 and the light collector 110 can be more easily arrayed, and a more uniform light distribution can be achieved on an exit surface of the array of the light collectors.

Since an LED emits less light than a conventional metal halide lamp or a super-high voltage mercury lamp, the light-emitting device 130 may include an array of LEDs.

Figure 7:
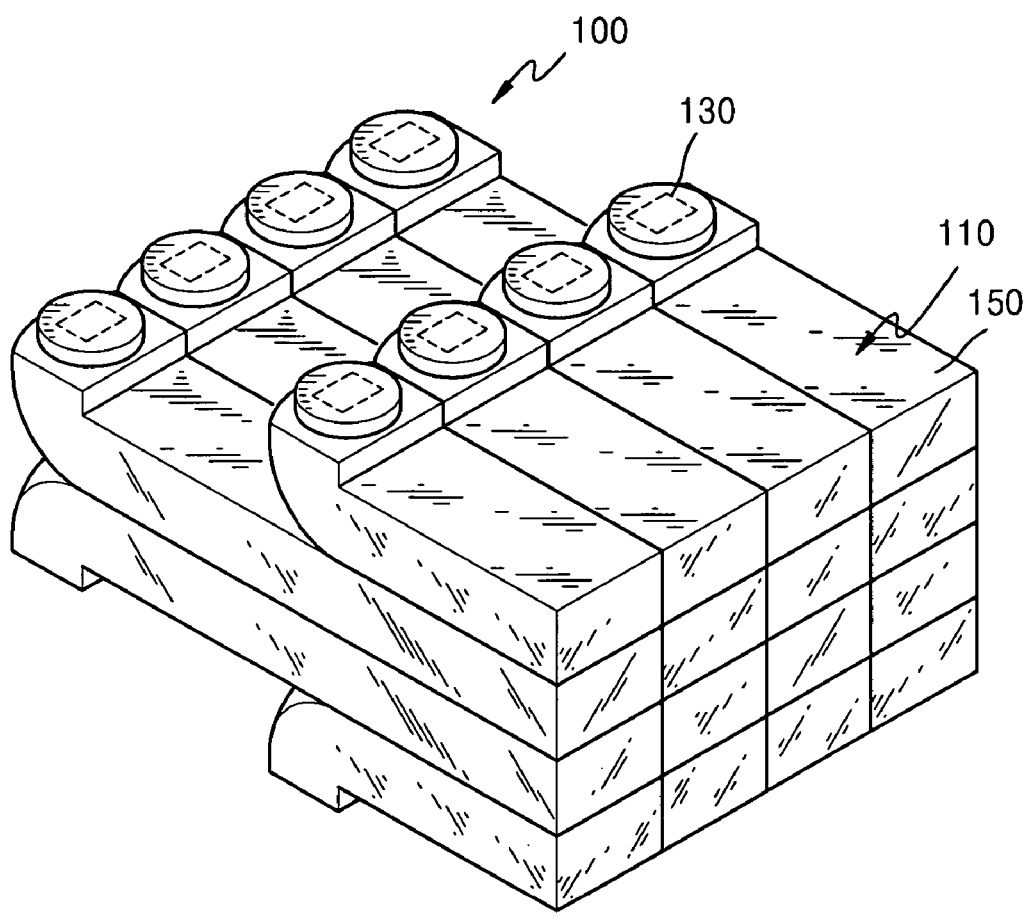
FIG. 7 is a perspective view of illumination units according to an embodiment of the present invention being formed as an array.

Thus, illumination unit 100 according to the present invention may be formed as an array, as shown in FIG. 7. FIG. 7 is a perspective view of illumination units 100 according to an embodiment of the present invention being formed as an array. Referring to FIG. 7, the illumination unit 100 includes a two-dimensional array of modules of light-emitting devices 130 and light collectors 110 in which a plurality of light collectors 110 are arranged in two dimensions and a plurality of light-emitting devices 130 respectively correspond to the light collectors 110. The light-emitting device 130 and the base 135 configure a light-emitting module.

Since the illumination unit 100 can collimate most light emitted from the light-emitting device 130 into substantially parallel light by recycling at least some light emitted from the light-emitting device 130 which may be lost, by means of the second reflective surface 140, the illumination unit 100 can have high light collecting efficiency and can be used as an illumination source for various systems. For example, the illumination unit 100 may be used as an illumination source for image projection apparatuses or as a headlight for vehicles.

An image projection apparatus using the illumination unit 100 as an illuminating light source according to various embodiments of the present invention will now be explained.

Figure 8:
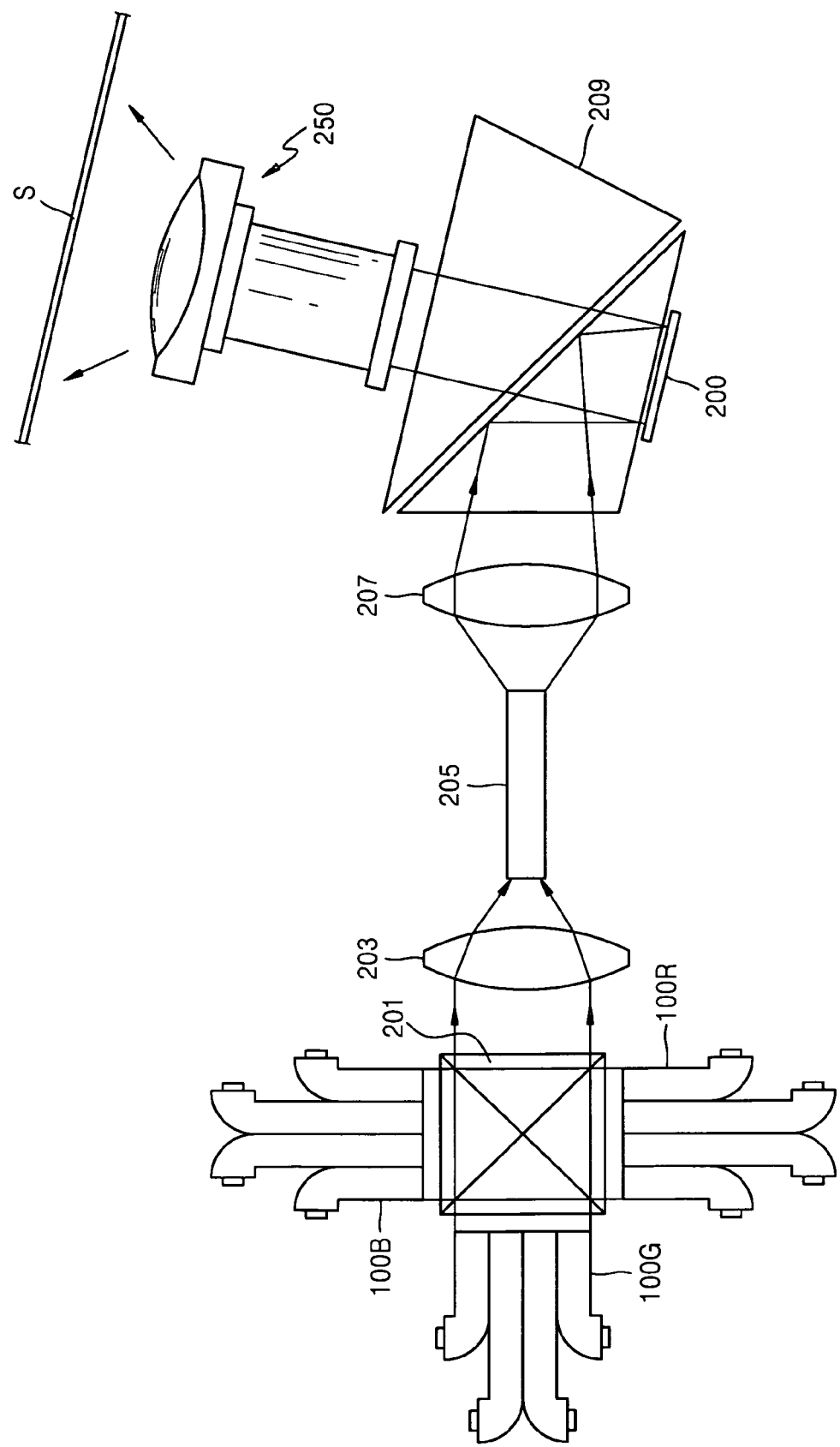
FIGS. 8 through 10 are top views of image projection apparatuses employing the illumination unit according to embodiments of the present invention.

FIG. 8 is a top view of an image projection apparatus employing the illumination unit 100 according to an embodiment of the present invention.

Referring to FIG. 8, the image projection apparatus includes first through third illumination units 100R, 100G, and 100B, an image-forming device forming an image in response to an image signal using light incident from the first through third illumination units 100R, 100G, and 100B, and a projection lens unit 250 enlarging and projecting the image formed by the image-forming device onto a screen s.

The first through third illumination units 100R, 100G, and 100B may each be an illumination unit 100 of an array form as shown in FIG. 7. That is, each of the first through third illumination units 100R, 100G, and 100B may include a two dimensional array of light collectors 110 and light-emitting devices 130 which correspond to each of the light collectors 110.

Since the light-emitting device such as an LED emits less light than a metal halide lamp or a super-high voltage mercury lamp, an array of light-emitting devices may be used.

The first through third illumination units 100R, 100G, and 100B may emit red light, green light, and blue light, respectively.

When the first through third illumination units 100R, 100G, and 100B emit different colors of light, a color synthesis prism 201, for example, an X-cube prism, may be further used to synthesize the different colors of light emitted from the first through third illumination units 100R, 100G, and 100B such that the synthesized colors of light can propagate along a single optical path. The image projection apparatus according to the present invention may include a single illumination unit emitting white light, and, in this case, the color synthesis prism 201 is not necessary.

The image projection apparatus according to the present invention may further include a light integrator that transforms incident light into uniform light. The light integrator integrates light incident along the same optical path after emission from the first through third illumination units 100R, 100G, and 100B and being synthesized such that the light is uniform.

The light integrator may be a rectangular parallelepiped light tunnel 205 as shown in FIG. 8. The rectangular parallelepiped light tunnel 205 may be hollow or an optical medium block. A pair of fly-eye lenses (see 320 in FIG. 9) may be used as the light integrator, instead of the light tunnel 205.

The first through third illumination units 100R, 100G, and 100B have a light exit surface, and the light tunnel 205 has a light incident surface. The light exit surface of the first through third illumination units 100R, 100G, and 100B and the light incident surface of the light tunnel 205 may have similar forms. The light exit surface of the first through third illumination units 100R, 100G, and 100B and the light incident surface of the light tunnel 205 may have a rectangular shape having the same aspect ratio as the image forming device 200.

To this end, the light guide portions 150 of the light collectors 110 in each of the first through third illumination units 100R, 100G, and 100B are arranged in a two dimensional array to form a rectangular shape having the same aspect ratio as the light tunnel 205.

The image projection apparatus of the present invention may further include a condenser lens 203 along an optical path between the color synthesis prism 201 and the light tunnel 205 to condense light emitted from first through third light source units 10a, 10b, and 10c and synthesized by the color synthesis prism 201 to direct the light along a single optical path such that the condensed light having reduced beam size is incident on the light tunnel 205.

In the present embodiment, the image-forming device is a reflective image-forming device, which controls incident uniform light for each pixel to produce an image.

In FIG. 8, the reflective image-forming device is a digital light processing (DLP) panel 200 or a digital micromirror device (DMD) with an array of micromirrors. The reflective image-forming device may be a reflective liquid crystal display (LCD). Alternatively, the image-forming device may be a transmissive LCD.

The DLP panel 200 includes a two-dimensional array of independently driven micromirrors, and creates an image by changing the angle of reflection light for each pixel based on an input image signal.

When the image-forming device is a reflective image-forming device, an optical path changer may be disposed between the light tunnel 205 and the reflective image-forming device to change the propagation path of incident light by directing light incident from the light tunnel 205 to the reflective image-forming device and light reflected by the reflective image-forming device to the projection lens unit 250. When the reflective image-forming device is the DLP panel 200, a total internal reflection (TIR) prism 70 may be used as the optical path changer as shown in FIG. 8.

A relay lens 207 may be disposed between the light integrator and the optical path changer, that is, between the light tunnel 205 and the TIR prism 70, to scale up or down light emitted from the light integrator according to the effective area of the image-forming device.

In the image projection apparatus according to the present embodiment, light containing image information formed on the DLP panel 200 is transmitted through the TIR prism 70 and directed to the projection lens unit 250, and the projection lens unit 250 enlarges and projects the image formed on the DLP panel 200 onto the screen s.

Figure 9:
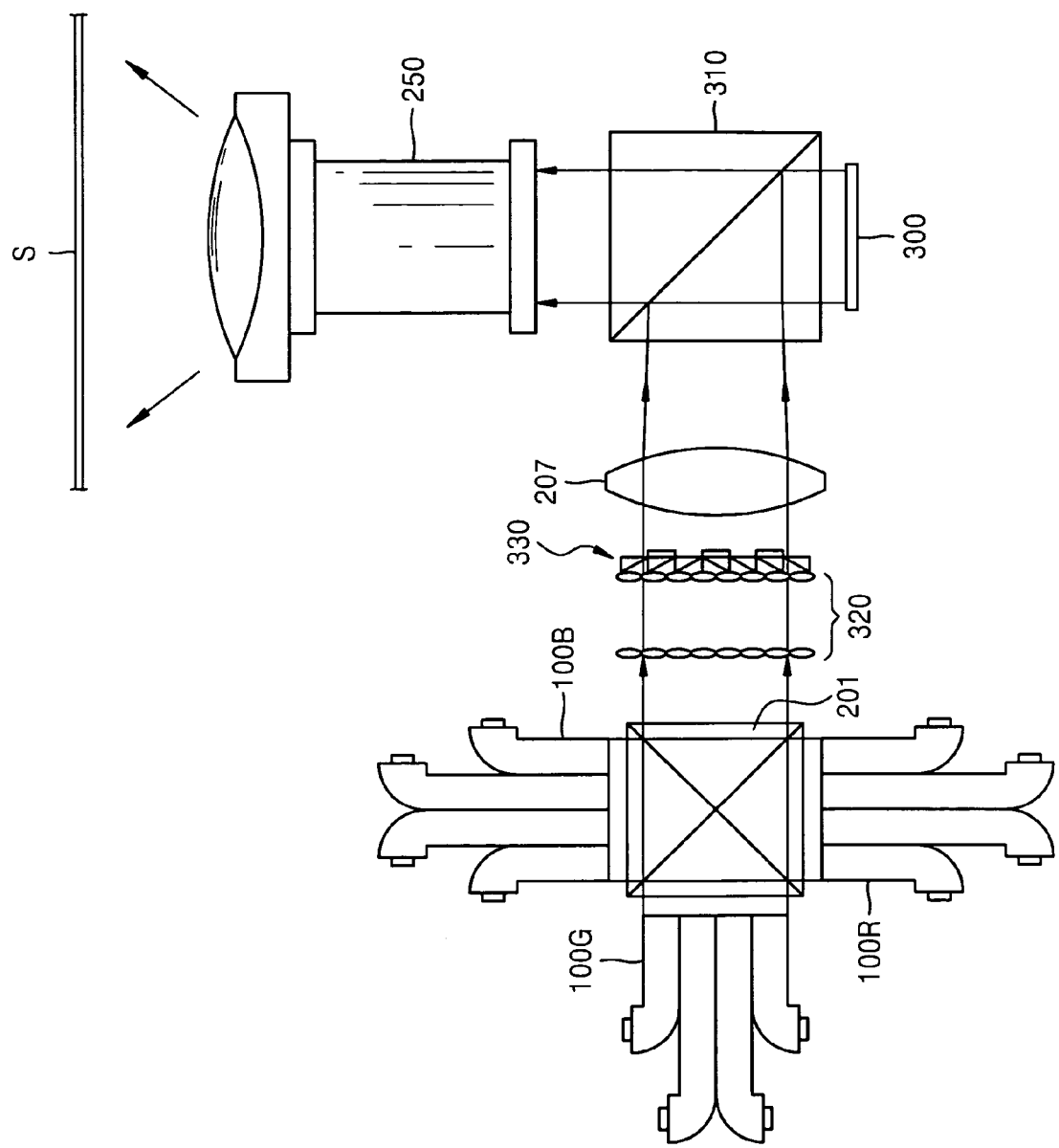

FIG. 9 is a top view of an image projection apparatus employing the illumination unit 100 according to another embodiment of the present invention. In the drawings, the same elements are designated by the same reference numerals, and a detailed explanation thereof will not be repeated.

Referring to FIG. 9, the image projection apparatus according to another embodiment of the present invention includes a reflective LCD 300 as an image-forming device, unlike the image projection apparatus illustrated in FIG. 8. The image projection apparatus according to the present embodiment may include a pair of fly-eye lenses 320 comprised of an array of a plurality of lens cells having the shape of a convex lens or cylindrical lens cells as the light integrator. Alternatively, the light tunnel 205 (see FIG. 8) may be used as the light integrator, instead of the fly-eye lenses 320.

The reflective LCD 300 selectively reflects incident uniform illuminating light for each pixel to produce an image. The reflective LCD 300 forms an image by changing the polarization state of incident light for each pixel based on an image signal to turn on or off light to be reflected.

When the image-forming device is the reflective LCD 300, a polarization beam splitter 310 may be used as an optical path changer to change the propagation path of incident light. The polarization beam splitter 310 changes the propagation path of incident light by directing light with a polarization incident from the first through third illumination units 100R, 100G, and 100B to the reflective LCD 300 and light with another polarization reflected by the reflective LCD 300 to the projection lens unit 250.

To increase light efficiency, a polarization converting unit 330 may be disposed along an optical path between the fly-eye lenses 320 and the polarization beam splitter 310 so that light emitted from the first through third illumination units 100R, 100G, and 100B and incident on the polarization beam splitter 310 has a single polarization. The polarization converting unit 330 converts most non-polarized light incident thereon into light with a specific polarization by separating light according to polarizations using a plurality of small polarization beam splitters and disposing a half-wave plate only in an optical path of light with a predetermined polarization. The polarization converting unit is well known in the art.

Figure 10:
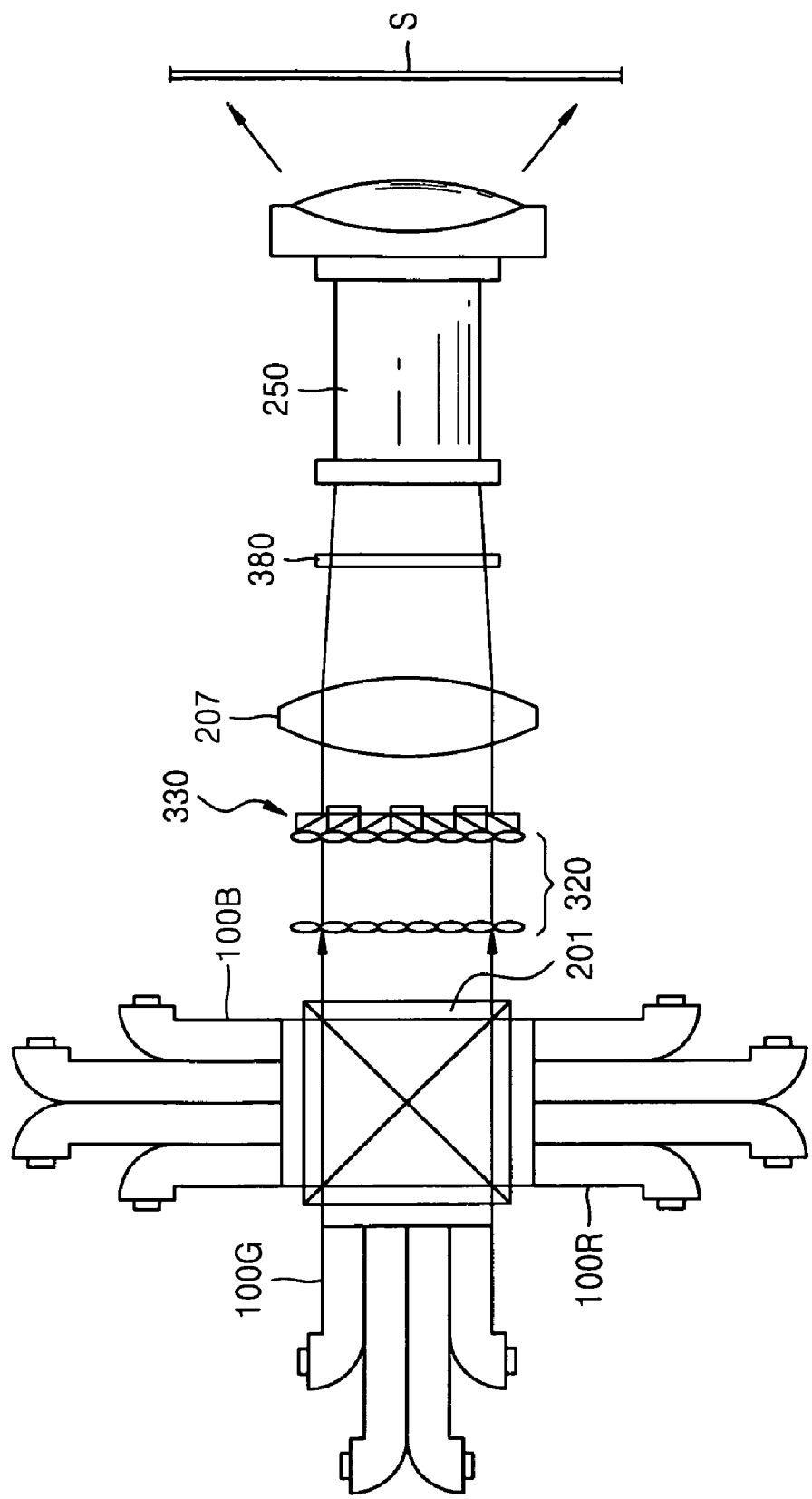

FIG. 10 is a top view of an image projection apparatus employing the illumination unit 100 according to still another embodiment of the present invention.

Referring to FIG. 10, the image projection apparatus according to still another embodiment of the present invention includes a transmissive LCD 380 as an image-forming device, unlike the image projection apparatus illustrated in FIG. 9. When the transmissive LCD 380 is used as the image-forming device, the polarization beam splitter 310 (see FIG. 9) functioning as the optical path changer is not necessary.

The transmissive LCD 380 forms an image by changing the polarization state of incident uniform light for each pixel based on an image signal to turn on or off light to be transmitted.

The illumination unit 100 can be applied to various image projection apparatuses as described above.

As described above, the illumination unit and the image projection apparatus employing the illumination unit can collimate most light emitted form the light-emitting device into substantially parallel light and thus ensure high light collecting efficiency without using lenses by using the second reflective surface that reflects light emitted from the light-emitting device and propagating outside the region of the first reflective surface back to the first reflective surface via the light-emitting device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An illumination unit comprising:
    a light source surface that is reflective and includes a light-emitting device generating and emitting illuminating light;
    a first reflective surface reflecting light emitted from the light-emitting device; and
    a second reflective surface reflecting light emitted from the light-emitting device to the light source surface,
    wherein the light source surface reflects the light reflected by the second reflective surface to the first reflective surface.

2. The illumination unit of claim 1, wherein the second reflective surface reflects light traveling outside a region of the first reflective surface back toward the light source surface.

3. The illumination unit of claim 1, wherein the first reflective surface has a focal point, and the light-emitting device is disposed at or around the focal point of the first reflective surface.

4. The illumination unit of claim 3, wherein at least one of the first and second reflective surfaces is selected from the group consisting of a parabolic reflective surface, a spherical reflective surface, and an elliptical reflective surface.

5. The illumination unit of claim 3, wherein the first reflective surface is a parabolic reflective surface and the second reflective surface is a spherical reflective surface.

6. The illumination unit of claim 5, wherein a spherical center of the second reflective surface and the focal point of the first reflective surface coincide.

7. The illumination unit of claim 6, wherein the light-emitting device is an organic light-emitting diode (OLED) or a light-emitting diode (LED) or arrays thereof.

8. The illumination unit of claim 1, wherein the light-emitting device is an OLED or an LED or arrays thereof.

9. The illumination unit of claim 1, comprising a transparent light collector having a light incident surface, wherein the second reflective surface is formed on a certain area of the light incident surface, and an outer side surface on which the first reflective surface is formed.

10. The illumination unit of claim 9, wherein the light collector includes a light guide portion guiding light reflected by the first reflective surface.

11. The illumination unit of claim 9, wherein the light incident surface of the light collector is concave, and a predetermined optical medium or an air layer exists between the light-emitting device and the light incident surface of the light collector.

12. The illumination unit of claim 11, wherein the light incident surface of the light collector has a concave dome shape.

13. The illumination unit of claim 9, comprising a two-dimensional array of the light collectors and a plurality of the light-emitting devices respectively corresponding to each of the light collectors.

14. An image projection apparatus comprising:
    at least one illumination unit;
    an image-forming device generating an image in response to an input image signal using light emitted from the illumination unit; and a projection lens unit enlarging and projecting the image formed by the image-forming device, wherein the illumination unit comprises:

a light source surface that is reflective and includes a light-emitting device generating and emitting illuminating light;

a first reflective surface reflecting light emitted from the light-emitting device; and a second reflective surface reflecting light emitted from the light-emitting device to the light source surface, wherein the light source surface reflects the light reflected by the second reflective surface to the first reflective surface.

15. The image projection apparatus of claim 14, wherein the second reflective surface reflects light traveling outside a region of the first reflective surface back toward the light source surface.

16. The image projection apparatus of claim 14, wherein the first reflective surface has a focal point, and the light-emitting device is disposed at or around the focal point of the first reflective surface.

17. The image projection apparatus of claim 16, wherein at least one of the first and second reflective surfaces is selected from the group consisting of a parabolic reflective surface, a spherical reflective surface, and an elliptical reflective surface.

18. The image projection apparatus of claim 16, wherein the first reflective surface is a parabolic reflective surface and the second reflective surface is a spherical reflective surface.

19. The image projection apparatus of claim 18, wherein a spherical center of the second reflective surface and the focal point of the first reflective surface coincide.

20. The image projection apparatus of claim 19, wherein the light-emitting device is an OLED or an LED or an array thereof.

21. The image projection apparatus of claim 14, wherein the light-emitting device is an OLED or an LED or an array thereof.

22. The image projection apparatus of claim 15, wherein the illumination unit comprises a transparent light collector having a light incident surface, wherein the second reflective surface is formed on a certain area of the light incident surface, and an outer side surface on which the first reflective surface is formed.

23. The image projection apparatus of claim 22, wherein the light collector comprises a light guide portion guiding light reflected by the first reflective surface.

24. The image projection apparatus of claim 22, wherein the light incident surface of the light collector is concave, and there exists a predetermined optical medium or an air layer between the light-emitting device and the light incident surface of the light collector.

25. The image projection apparatus of claim 24, wherein the light incident surface of the light collector has a concave dome shape.

26. The image projection apparatus of claim 22, wherein the illumination unit comprises a two-dimensional array of the light collectors and a plurality of the light-emitting devices respectively corresponding to each of the light collectors.

27. The image projection apparatus of claim 26, wherein the image-forming device is selected from the group consisting of a transmissive liquid crystal display device, a reflective liquid crystal display device, and a reflective image-forming device comprising an array of micromirrors that selectively reflect the light emitted from the illumination units to form an image.

28. The image projection apparatus of claim 22, wherein the at least one illumination unit comprises a plurality of the illumination units emitting light of different colors, the image projection apparatus further comprising a color synthesis prism synthesizing the light of different colors emitted from the plurality of illumination units such that the synthesized light of different colors propagates along one optical path.

29. The image projection apparatus of claim 28, further comprising a light integrator transforming the light of different colors emitted from the plurality of illumination units into uniform light.

30. The image projection apparatus of claim 22, wherein the illumination unit comprises a transparent light collector that includes a concave dome-shaped light incident surface and a light guide portion guiding light reflected by the first reflective surface, wherein the second reflective surface is formed on a certain area of the light incident surface of the light collector on which light is incident from the light-emitting device, the first reflective surface is formed on an outer side surface of the light collector, and a predetermined optical medium or an air layer exists between the light-emitting device and the light incident surface of the light collector, wherein the at least one illumination unit comprises a plurality of illumination units emitting light of different colors, the image projection apparatus further comprising:

a color synthesis prism synthesizing the light emitted from the plurality of illumination units such that the synthesized light of different colors propagates along one optical path; and a light integrator transforming the light emitted from the plurality of illumination units into uniform light, wherein the image-forming device is selected from the group consisting of a transmissive liquid crystal display device, a reflective liquid crystal display device, and a reflective image-forming device comprising an array of micromirrors that selectively reflect the light emitted from the illumination units to form an image.

31. The image projection apparatus of claim 30, wherein each of the illumination units includes a two-dimensional array of the light collectors and a plurality of the light-emitting devices respectively corresponding to the light collectors.

* * * * *